United States Patent [19]

Mimura

[11] Patent Number: 4,663,643
[45] Date of Patent: May 5, 1987

[54] SEMICONDUCTOR DEVICE AND PROCESS FOR PRODUCING THE SAME

[75] Inventor: Takashi Mimura, Machida, Japan

[73] Assignee: Fujitsu Limited, Kawasaki, Japan

[21] Appl. No.: 371,465

[22] Filed: Apr. 23, 1982

[30] Foreign Application Priority Data

Apr. 23, 1981 [JP] Japan .................................. 56-61710
Apr. 30, 1981 [JP] Japan .................................. 56-65548

[51] Int. Cl.$^4$ ..................... H01L 29/80; H01L 29/76; H01L 29/205; H01L 29/201
[52] U.S. Cl. ........................................ 357/22; 357/16; 357/52
[58] Field of Search .................. 357/22 P, 22 S, 22 E, 357/16, 22, 52; 148/DIG. 72, DIG. 56

[56] References Cited

U.S. PATENT DOCUMENTS

| | | | |
|---|---|---|---|
| 3,993,506 | 11/1976 | Moon | 357/52 |
| 4,075,652 | 2/1978 | Umebachi et al. | |
| 4,141,021 | 2/1979 | Decker | 357/52 |
| 4,163,237 | 7/1979 | Dingle et al. | 357/16 |
| 4,173,764 | 11/1979 | de Cremoux | |
| 4,231,050 | 10/1980 | Casey et al. | 357/52 |
| 4,424,525 | 1/1984 | Mimura | 357/16 |
| 4,426,656 | 1/1984 | Dilorenzo | 357/52 |

FOREIGN PATENT DOCUMENTS

| | | | |
|---|---|---|---|
| 0017531 | 10/1980 | European Pat. Off. | 357/16 |
| 0025741 | 3/1981 | European Pat. Off. | 357/22 S |
| 2386903 | 11/1978 | France | |
| 0117281 | 9/1980 | Japan | 357/16 |

OTHER PUBLICATIONS

Alferov et al., "AlAs–GaAs Heterojunction . . . ", Mar. 70, Soviet Physics–Semiconductors, vol. 3, No. 3, pp. 1107–1110.
Mimura et al., Jap. Jour. of App. Phys, vol. 19, No. 5, May 1980, pp. L225–L227, "A New . . . Heterojunctions".
Delage Beaudeuf et al., "Two . . . Structure", Elec. Lettr. 14 Aug. 1980, vol. 16, No. 17, pp. 667–668.
8179 IEEE Electron Device Letters, "Modulation–Doped MBE GaAs/n–Al$_x$Ga$_{1-x}$As MESFETs", Wira et al., vol. EDL-2, No. 1, Jan. 1981, pp. 14–15.
8093 IEEE Trans on Electron Devices, "A Study of High-Speed Normally Off and Normally On Al$_{0.5}$Ga$_{0.5}$As Heterojunction Gate GaAs FET's (HJFET)", Morkoc et al., vol. ED-25, No. 6, Jun. 6, 1978, pp. 619–626.

Primary Examiner—Andrew J. James
Assistant Examiner—Jerome Jackson
Attorney, Agent, or Firm—Staas and Halsey

[57] ABSTRACT

The present invention is an improvement in a normally off-type high electron mobility transistor (HEMT) having a first single crystalline semiconductor layer, such as an undoped GaAs layer, and a second single crystalline semiconductor layer, such as an N-doped AlGaAs layer, having an electron affinity different from that of the first single crystalline semiconductor layer. A heterojunction is formed between the first and second single crystalline semiconductor layers. An electron-storing layer is formed adjacent to the heterojunctions serving as a conduction channel having a quasi two-dimensional electron gas. The concentration of electron gas is controlled by a gate electrode. An additional semiconductor layer, such as an N-doped GaAs layer, is formed at a portion of the second single crystalline layer in the area adjacent to the gate electrode. The additional semiconductor layer can generate the quasi two-dimensional electron gas even when no such gas is generated under the crystal parameter of the first and second single crystalline semiconductor layers. This generation of the quasi two-dimensional electron gas ensures that the HEMT has good reproducibility in respect to normally off-type operation.

31 Claims, 15 Drawing Figures

SEMICONDUCTOR DEVICE AND PROCESS FOR PRODUCING THE SAME

BACKGROUND OF THE INVENTION

The present invention relates to a semiconductor device and a process for producing the same. More particularly, the present invention relates to an improvement of a high electron mobility transistor, hereinafter referred to as a HEMT, and an improved process for producing a HEMT.

The HEMT is an active semiconductor device and its operating principle is completely distinguishable from that of silicon ICs and the GaAs FETICs.

The HEMT has a first single crystalline semiconductor layer, a second single crystalline semiconductor layer having an electron affinity different from that of the first single crystalline semiconductor layer and forming a heterojunction with respect to the first single crystalline semiconductor layer, and a gate electrode on the second single crystalline semiconductor layer. An electron-storing layer is formed in proximity to the heterojunction due to the difference in the electron affinity and is used as the conduction channel of the HEMT. The electron mobility of the HEMT is approximately 10 times that of GaAs FETICs and approximately 100 times that of silicon ICs, at the temperature of liquid nitrogen (77K). The electron-storing layer mentioned above contains a quasi two-dimensional electron gas, the electrons of which gas being predominent current-conduction carriers of the HEMT. In addition, the sheet-electron concentration of the quasi two-dimensional electron gas is controlled by applying voltage through the gate electrode. The impedance of the conduction channel is controlled by a pair of electrodes located beside the gate electrode. A very high electron mobility of the HEMT at a low temperature, for example at 77K, is due to the fact that the electron mobility of the quasi two-dimensional electron gas is very high at such a temperature where impurity scattering predominantly controls the electron mobility. The quasi two-dimensional electron gas is formed in proximity to the heterojunction, as stated above, and the thickness of the quasi two-dimensional electron gas is approximately the amount of spreading electron waves or on the order of ten angstroms. The relationship between the quasi two-dimensional electron gas and the single crystalline semiconductor layers which supply electrons to the electron storing layer is a spatially separated one, with the result that the electron mobility of the quasi two-dimensional electron gas is not lessened due to the reduction of impurities in one single crystalline semiconductor layer. As a result, it is possible to achieve a very high electron mobility at a low temperature where the electron mobility is predominantly controlled by impurity scattering.

There are two types of operation of the HEMT, namely the normally on-type (depletion (D) type) of operation and the normally off-type (enhancement (E) type) of operation. The layer structure and the thickness of the first and second single crystalline semiconductor layers determine which type of operation the HEMT has. More specifically, in a case where the electron affinity of the second single crystalline semiconductor layer is greater than that of the first single crystalline semiconductor layer, the normally on-type operation occurs when the metallurgical thickness of the second single crystalline semiconductor layer (upper layer) is greater than a certain critical amount which depends on the aforementioned three parameters and the properties of the gate which is to be formed on the upper layer. The normally off-type operation occurs when the metallurgical thickness of the upper layer is smaller than the certain critical amount mentioned above. Similarly, in a case where the second (upper) and first (lower) single crystalline layers have a small and great electron affinity, respectively, the normally on-type operation occurs when the metallurgical thickness of the lower layer is greater than a certain critical amount, which depends on the layer parameters. The normally off-type operation occurs when the metallurgical thickness of the lower layer is smaller than the certain critical amount. The metallurgical thickness is hereinafter simply referred to as the thickness.

The prior art is explained more in detail with reference to FIGS. 1 through 3.

Referring to FIG. 1, $Ec_1$ indicates the energy of the electrons in the second single crystalline semiconductor layer having a low electron affinity, for example, an N-doped AlGaAs (aluminum gallium arsenide) layer, and $Ec_2$ indicates the energy of the electrons in the first single crystalline semiconductor layer having a high electron affinity, for example, an undoped GaAs layer. Because of the difference in the electron affinity, a substantial part of the electrons in the N-doped AlGaAs layer are attracted to the undoped GaAs layer and quasi two-dimensional electron gas (2DEG) is formed as shown in FIG. 1 while the positively ionized impurities (+) remain in the N-doped AlGaAs layer. The symbol "$E_F$" indicates the Fermi level, and the symbol "Ecg" indicates an energy gap, at the interface of the heterojunction between the N-doped AlGaAs layer and the undoped GaAs layer. The two semiconductors capable of forming the heterojunction of the HEMT should have a sufficient difference in electron affinity, as was explained above. Furthermore, since the region near the interface of the heterojunction should be free of any crystal defects, the lattice constants of the two semiconductors should be close to one another. In addition, in order to attain a satisfactorily high energy gap (Ecg) at the interface of the heterojunction, the difference between the energy gap in the two semiconductors should be great. The types of semiconductors which satisfy the above-described three properties, i.e. electron affinity, lattice constant, and energy gap, are numerous as shown in Table 1.

TABLE 1

| Nos. | Semiconductors | Band Gap (eV) | Lattice Constants (Å) | Electron Affinity (eV) |
|---|---|---|---|---|
| 1 | Aluminum gallium arsenide ($Al_{0.3}Ga_{0.7}As$) | 1.8 | 5.657 | 3.77 |
|   | Gallium arsenide | 1.43 | 5.654 | 4.07 |
| 2 | Aluminum gallium arsenide ($Al_{0.3}Ga_{0.7}As$) | 1.8 | 5.657 | 3.77 |
|   | Germanium | 0.66 | 5.658 | 4.13 |
| 3 | Gallium arsenide | 1.43 | 5.654 | 4.07 |
|   | Germanium | 0.66 | 5.658 | 4.13 |
| 4 | Cadmium telluride | 1.44 | 6.477 | 4.28 |
|   | Indium antimonide | 0.17 | 6.479 | 4.59 |
| 5 | Gallium antimonide | 0.68 | 6.095 | 4.06 |
|   | Indium arsenide | 0.36 | 6.058 | 4.9 |

Referring to FIG. 2, a conventional normally off-type HEMT is shown. Reference numeral 1 indicates a substrate made of single crystalline semi-insulating semiconductor material. Reference numeral 2 indicates the undoped GaAs layer 2, i.e. the first single crystalline semiconductor layer having a great electron affinity. On the undoped GaAs layer 2, the N-doped AlGaAs layer 3 and a gate electrode 6 are successively formed. The aluminum gallium arsenide of the N-doped AlGaAs layer 3 is the main composition of the second single crystalline semiconductor layer and has a small electron affinity, and the gate electrode 6 controls the concentration of the quasi two-dimensional electron gas 5 in the electron-storing layer 18. The electrons of the quasi two-dimensional electron gas 5 are supplied from the N-doped AlGaAs layer 3 into the undoped GaAs layer 2 when a predetermined voltage is applied via the gate electrode 6 to the heterojunction at an energized state. The N+-doped regions are selectively formed on the undoped GaAs layer 2 in a selfalignment manner with respect to the N-doped AlGaAs layer 3. These N+-doped regions are the source region 4A and drain region 4B, and the distance between the source region 4A and the drain region 4B corresponds to the gate length. The source electrode 7A and the drain electrode 7B control the impedance of the conduction channel or the impedance of the undoped GaAs layer 2 in proximity to the interface 8 of the heterojunction.

The HEMT has an advantage of high electron mobility, as stated above, and therefore is able to provide super high-speed logic elements. When the gate length is shortened, the high-speed feature of the HEMT becomes more outstanding due to the shortened traveling time of the electrons. However, when the gate length is considerably shortened, the distance between the source region 4A and the drain region 4B may be so short that a punch-through phenomenon occurs, resulting in electrons in the source region 4A being injected into the undoped GaAs layer 2. When the punch-through phenomenon occurs, the threshold voltage of the HEMT is disadvantageously decreased.

In the HEMT, the quasi-dimensional electron gas 5, the electons of which gas being the predominant current-conduction carriers in the HEMT, is generated due to the difference in electron affinity, and the normally off-type operation is achieved when the thickness of the N-doped AlGaAs layer 3 (the semiconductor having a small electron affinity) is smaller than that of the undoped GaAs layer 2 (the semiconductor having a great electron affinity) by a certain critical value. Therefore, the normally off-type operation can also be achieved in the structure shown in FIGS. 2 and 3. The N-doped AlGaAs layer 3 shown in FIG. 2 has been selectively removed so that the quasi two-dimensional electron gas 5 is generated upon the application of voltage from the gate electrode 6 exclusively beneath the N-doped AlGaAs layer 3. Contrary to this, in a normally off-type HEMT such as shown in FIG. 3, the N-doped AlGaAs layer 3 is not selectively removed but is formed entirely on the undoped GaAs layer 2 while the gate electrode 6 is embedded in the N-doped AlGaAs layer. In addition, no quasi two-dimensional electron gas 5 is formed in the conduction channel beneath the gate electrode 6 by means of selectively decreasing the thickness of the N-doped AlGaAs layer 3.

The quasi two-dimensional electron gas 5 is formed in the undoped GaAs layer 2 is proximity to the interface 8 of the heterojunction between the undoped GaAs layer 2 and the N-doped AlGaAs layer 3 on which the gate electrode 6 is not located. The source region 4A and drain region 4B are not positioned in a self-alignment relationship with respect to the gate electrode 6, but they are sufficiently separated from the conduction channel 9. In the normally off-type HEMT shown in FIG. 3, it is not necessary to shorten the distance between the source region 4A and the drain region 4B, but, it is only necessary to decrease the length of the gate electrode 6 so that the traveling time of the electrons across the conduction channel 9 is shortened. It would be quite obvious to an expert having an ordinary knowledge of HEMTs as to how to modify the normally off-type HEMT shown in FIG. 2 so as to devise the one shown in FIG. 3. Nevertheless, the normally off-type HEMT shown in FIG. 3 is not realistic for the following reasons.

The most important thing in the production of HEMT's is to stably form or not form a quasi two-dimensional electron gas 5 (FIGS. 2 and 3) and 2 DEG (FIG. 1) in the conduction channel 9. In order to stably form or not form a quasi two-dimensional electron gas in the conduction channel 9, not only the selection of the above-described three properties, i.e. electron affinity, lattice constant and energy gap, but also strict control of the thickness of the undoped GaAs layer 2 and the N-doped AlGaAs layer 3 must be carried out. Furthermore, the interface 8 of the heterojunction must be provided with such a structure that the composition abruptly changes from, for example, AlGaAs to GaAs at the interface 8. The type of technique of crystal growth by which strict control of the thickness of the undoped GaAs layer 2 and the N-doped AlGaAs layer 3 and an abrupt change in the composition can now be achieved is the molecular beam epitaxy (MBE) method. With this method the crystal growth rate can be strictly controlled so that one atom layer epitaxially grows per second. Therefore, the crystal growth of the undoped GaAs layer 2 and the N-doped AlGaAs layer 3 is carried out by means of the MBE method. In addition, the N-doped AlGaAs layer 3 (FIG. 2) must be selectively removed with such accuracy that the quasi two-dimensional electron gas 5 is not formed in the conduction channel 9 in the normal state. However, the accuracy of conventional etching methods cannot exceed the order of 100 angstroms and are not at all sufficient for stably attaining the normally off-type operation or for precisely controlling the threshold voltage of a HEMT.

SUMMARY OF THE INVENTION

It is an object of the present invention to provide a normally off-type HEMT in which the gate length is advantageously shortened without resulting in a punch-through phenomenon and in which the normally off-type operation, involving a stable threshold voltage, is easily attained with good reproducibility.

It is another object of the present invention to provide a simple and reliable process for producing the normally off-type HEMT mentioned above.

In accordance with the objects of the present invention, there is provided a HEMT having:

a first single crystalline semiconductor layer;

a second single crystalline semiconductor layer having an electron affinity different from that of the first single crystalline semiconductor layer;

a heterojunction between the first and second single crystalline semiconductor layers;

an electron-storing layer for forming a conduction channel, formed in proximity to the heterojunction due to the difference in electron affinity; and a gate electrode for controlling the concentration of the quasi two-dimensional electron gas in the conduction channel, wherein an additional semiconductor layer, having a different semiconductor than that of the second single crystalline layer, is formed on at least a part of the second single crystalline layer adjacent to the gate electrode.

According to the embodiment of the HEMT of the present invention, the first and second single crystalline semiconductor layers are mainly composed of III-V group compounds, e.g. GaAs and AlGaAs, respectively. The AlGaAs layer is usually N-doped and contains impurities at a concentration of, for example, from $5 \times 10^{17}$ to $5 \times 10^{18}$/cm$^3$.

According to another embodiment of the HEMT of the present invention, the additional single crystalline semiconductor layer is mainly composed of a III-V group compound, e.g. GaAs.

DESCRIPTION OF THE PREFERRED EMBODIMENTS

Figure 4:
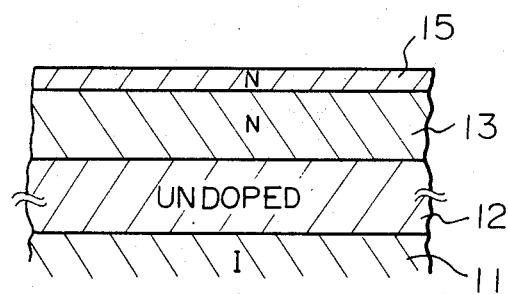
FIG. 4 is a drawing explaining operation of the HEMT according to the present invention.

Referring to FIG. 4, an undoped GaAs layer 12, which is the first single crystalline semiconductor layer is epitaxially grown on a substrate 11 made of semi-insulating GaAs (gallium arsenide). An N-doped AlGaAs layer 13, which is the second single crystalline semiconductor layer, is epitaxially grown on the first single crystalline layer 12 and an N-doped GaAs layer 15 is then formed on the N-doped AlGaAs second single crystalline layer 13.

The principle of the present invention will be apparent from the descriptions of FIG. 5, in which the abscissa and the ordinate indicate, respectively, the thickness of the N-doped GaAs layer 15 (FIG. 4) and the sheet-electron concentration of the quasi two-dimensional electron gas at 77K, which is generated in proximity to the heterojunction between the undoped GaAs layer 12 and the N-doped AlGaAs layer 13 and hereinafter simply referred to as the sheet-electron concentration. The data of FIG. 5 was obtained regarding the following compositions and thickness of the layers, i.e. the crystal parameter.

TABLE 2

| Crystals | Thickness (angstroms) | Concentration of Impurities (Si) (cm$^{-3}$) |
|---|---|---|
| The undoped GaAs layer 12 | 2,000 | about $10^{16}$ |
| The N-doped AlGaAs layer 13 (Al$_{0.3}$Ga$_{0.7}$As) | 200 | $2 \times 10^{18}$ |
| The N-doped GaAs layer 15 | 100-600 | $2 \times 10^{18}$ |

The electron concentration was measured on the basis of the Hall effect.

Figure 5:
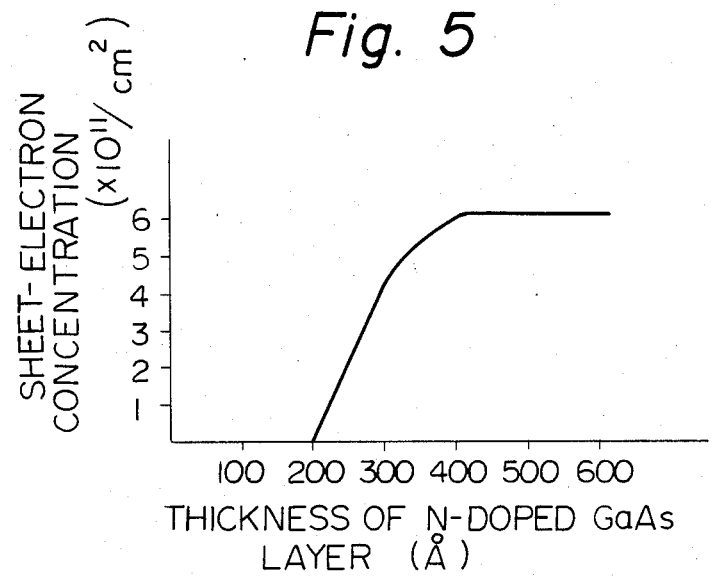
FIG. 5 is a graph of the sheet-electron concentration of the quasi two-diimensional electron gas that can be controlled by the thickness of an additional semiconductor layer formed on the conventional HEMT.

As can be seen in FIG. 5, the sheet-electron concentration is zero since no quasi two-dimensional electron gas is formed when the thickness of the N-doped GaAs layer 15 (FIG. 4) is less than 200 angstroms. That is, no quasi two-dimensional electron gas is generated when the thickness of the N-doped GaAs layer 15 is less than the critical value, which depends upon the crystal parameters. When the thickness of the N-doped GaAs layer 15 is 200 angstroms or more, the quasi two-dimensional electron gas is generated, and the sheet-electron concentration reaches $6 \times 10^{11}$/cm$^2$ and is saturated at a thickness of 400 angstroms. The two types of operation of the HEMT are determined on the basis of the ability of the N-doped GaAs layer 15 to control the generation of quasi two-dimensional electron gas.

A theoretical explanation of the results shown in FIG. 5 is as follows. The top surface of the N-doped GaAs layer 15 is exposed to or is in contact with a vacuum, air or another medium, and has a surface potential which depends on the physical properties of such medium. The top surface of the N-doped GaAs layer 15 is essentially converted to a depletion layer which is free of electrons, and the number of electrons moving towards the top surface is decreased. This in turn leads to the generation of the quasi two-dimensional electron gas in proximity to the heterojunction between the undoped GaAs layer 12 and the N-doped AlGaAs layer 13. The present invention is therefore based on the discovery that even under the crystal parameter of the first and second single crystalline semiconductor layers which cannot generate the quasi two-dimensional electron gas in proximity to the heterojunction between these two layers, the generation of quasi two-dimensional electron gas can be realized due to the provision of an additional semiconductor layer. In the case of the crystal parameter given in Table 2, when the thickness of the N-doped GaAs layer 15 (FIG. 4) is less than approximately 400 angstroms, the sheet-electron concentration is less than the saturated value or is zero since the surface state of the N-doped GaAs layer 15 influences the generation of the quasi two-dimensional electron gas in proximity to the heterojunction mentioned above.

Figure 1:
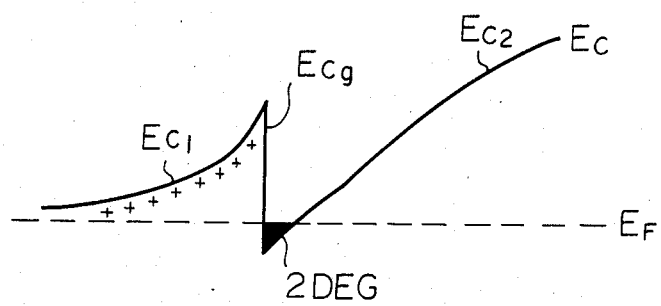
FIG. 1 is an energy diagram near the interface of the heterojunction of a HEMT.
Figure 2:
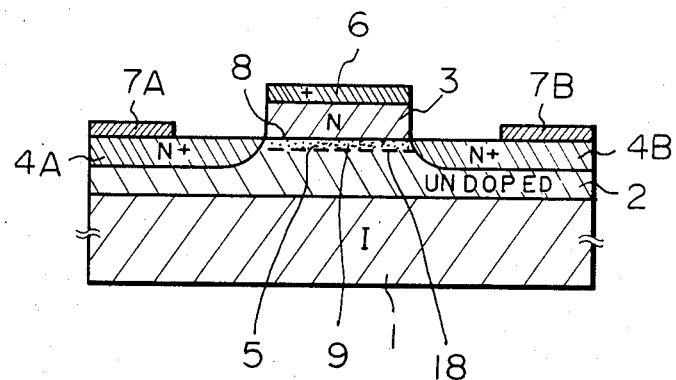
FIG. 2 shows the structure of a conventional normally off-type HEMT.

Consequently, the results shown in FIG. 5 can be applied in the formation of the normally off-type HEMT while eliminating the disadvantages due to etching to one of the single crystalline semiconductor layers of the HEMT, e.g. the N-doped AlGaAs layer 3 (FIG. 2). The additional semiconductor layer of the present invention, which is selectively formed on the second single crystalline semiconductor layer, can provide a crystal parameter such that the quasi two-dimensional electron gas is selectively formed at the heterojunction between the first and second single crystalline semiconductor layers beneath the additional semiconductor layer. On the other hand, the gate electrode can apply voltage to the heterojunction mentioned above and thus generate quasi two-dimensional electron gas in proximity to a non-selected part of the heterojunction thereunder. The quasi two-dimensional electron gas formed under a zero gate bias condition beneath the additional semiconductor layer is contiguous to the quasi two-dimensional electron gas formed beneath the gate electrode in the electrically energized state and thus the conduction channel is formed. The additional semiconductor layer must be present at least in an area adjacent to the gate electrode. Since one of the single crytalline semiconductor layers having a high electron affinity in the HEMT provides a place for the two-dimensional electron gas to form in proximity to the heterojunction, the one single crystalline semiconductor layer should not be intentionally doped, it should be undoped. "Undoped" means that the single crystalline semiconductor is essentially free of the impurities. "Essentially free of the impurities" means in turn that the impurity concentration is not exactly zero but is rather of such a value that impurity scattering is effectively decreased. Particularly, the impurity concentration of the "undoped" single crystalline semiconductor layer in which the electron-storing layer is formed in proxmity to the heterojunction may be approximately one tenth, at the highest, that of the N-doped single crystalline semiconductor layer which supplies electrons to the electron-storing layer. The presence or absence of an additional semiconductor layer on the part of the second single crystalline semiconductor layer separated from the gate electrode, is optional and an additional semiconductor layer on the part mentioned above may be embodied in various forms. According to an embodiment of the present invention, an additional semiconductor layer is formed or interposed between the gate electrode and the second single crystalline semiconductor layer, and the thickness of the additional semiconductor layer beneath the gate electrode is smaler than that of the additional semiconductor layer adjacent to the gate electrode. In this embodiment, the former thickness is selected so that in the normal state, that is, in the state where no gate potential is applied, no quasi two-dimensional electron gas is formed in proximity to the heterojunction beneath the gate electrode mentioned above. According to another embodiment of the present invention, the additional semiconductor layer extends from an area adjacent to the gate electrode to the top of the gate electrode.

In yet another embodiment of the present invention, a normally on-type HEMT is included in a semiconductor device in addition to a normally off-type HEMT and a complementary HEMT (E/D mode-HEMT) can be provided. That is, an additional semiconductor layer is present not only in a first part of the semiconductor device where the normally off-type HEMT is to be formed but also in a second part of the semiconductor device where the normally on-type HEMT is to be formed. The fact that quasi two-dimensional electron gas is generated in a normal state in proximity to the heterojunction beneath the second part of the semiconductor device leads directly to the possibility of a normally on-type HEMT being formed. In the normally on-type HEMT, ohmic contact between the source and drain electrodes and the additional semiconductor layer can be more easily achieved as compared with the conventional normally on-type HEMT.

The present invention is further explained with reference to FIGS. 6 through 10 illustrating several embodiments of the normally off-type HEMT.

Figure 6:
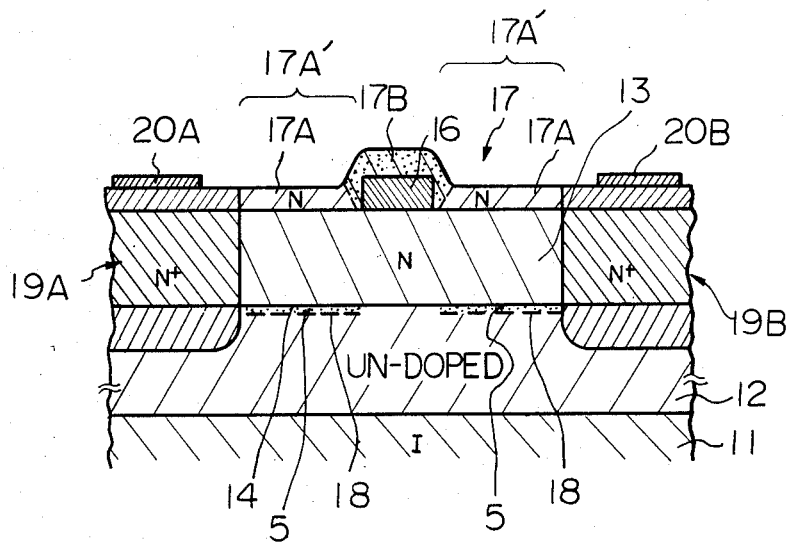
FIGS. 6 through 10 show embodiments of the normally off-type HEMT according to the present invention.

Referring to FIG. 6, the normally off-type HEMT comprises a substrate 11 made of semi-insulating single crystalline GaAs. On the substrate 11, the following layers are epitaxially grown by means of the MBE method: an undoped GaAs layer 12 of, for example, 2,000 angstroms in thickness, as the first single crystalline semiconductor layer and an N-doped AlGaAs layer 13 as the second single crystalline semiconductor layer, which for example, has a thickness of from 200 to 1000 angstroms. Layer 13 is mainly composed of $Al_{0.3}Ga_{0.7}As$, and contains silicon as the N-type conductivity impurity. The concentration of the N-type conductivity impurities may be from $5 \times 10^{17}$ to $5 \times 10^{18}/cm^3$. A gate electrode 16 made of, for example, aluminum is deposited on the N-doped AlGaAs layer 13.

The additional semiconductor layer of the present invention is collectively denoted by reference numeral 17 in FIG. 6 and extends from an area adjacent to 17A' of the gate electrode 16 to the top of the gate electrode 16. The main composition of the additional semiconductor layer 17 is different from that of the second single crystalline semiconductor layer, i.e. AlGaAs in the present case, and may be GaAs. The additional semiconductor layer 17 is preferably free of aluminum since aluminum, which is an easily oxidizable metal, is harmful to the surface properties of the HEMT. In a case where the additional semiconductor layer 17 is mainly composed of GaAs, the GaAs may have an N-type conductivity and the concentration of N-type conductivity impurity, e.g. Si, may be in the range from $5 \times 10^{17}$ to $5 \times 10^{18}/cm^3$, for example, approximately $2 \times 10^{18}/cm^3$. The description hereafter refers to a case where the additional semiconductor layer 17 is an N-doped GaAs layer. The N-doped GaAs layer 17 has a thickness in the range of from 200 to 1000 angstroms, for example, 400 angstroms. The N-doped GaAs layer grown on the N-doped AlGaAs layer 13 is single crystalline (17A) and the N-doped GaAs layer grown on the gate electrode 16 is amorphous and has a high resistivity (17B). The effective part of the additional semiconductor layer 17, i.e. the part which exerts an influence on the generation of the quasi two-dimensional electron gas in proximity to the heterojunction 14, is locally thick on the surface of the N-doped AlGaAs layer 13 where the gate electrode 16 is not deposited. Therefore, the electron-storing layer 18 is selectively formed in the undoped GaAs layer 12 in proximity to the heterojunction 14.

The normally off-type HEMT shown in FIG. 6 has a source region 19A and a drain region 19B which are formed by diffusing or ion-implanting N-type impurities into the additional semiconductor layer 17, the N-doped AlGaAs layer 13, and the undoped GaAs layer 12. In the source region 19A and the drain region 19B, the source electrode 20A and the drain electrode 20B are formed by means of a deposition method. The source electrode 20A and the drain electrode 20B may be made off gold or a gold-germanium alloy. In order to alloy the gold or the like with the additional semiconductor layer 17, a heat treatment at a temperature of approximately 450° C. is carried out after a deposition method is carried out.

In the normally off-type HEMT shown in FIG. 6, the distance between the source region 19A and the drain region 19B is large enough to prevent the occurrence of the punch-through phenomenon. Nevertheless, the electron-storing layer 18 containing the quasi two-dimensional electron gas 5 is selectively formed in the undoped GaAs layer 12 in proximity to the heterojunction 14. That is, no electron-storing layer 18 is formed beneath the gate electrode 16. This means that the electron-storing layer 18 is formed in self-alignment with respect to the gate electrode 16 and the distance between the source region 19A and the drain region 19B essentially coincides with the gate length. This distance is very short, for example, 5000 to 50,000 angstroms, but does not result in the punch-through phenomenon. The normally off-type HEMT of the present invention can therefore exhibit a considerably higher operation speed as compared with the conventional normally off-type HEMT.

Figure 7:
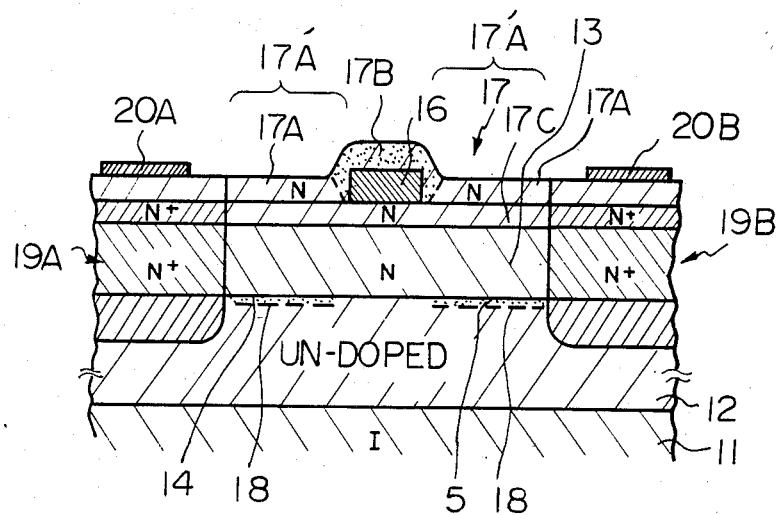

Referring to FIG. 7, the HEMT according to an embodiment of the present invention has the same structure as the HEMT shown in FIG. 6 except that the additional semiconductor layer 17 comprises, in addition to the single crystalline N-doped GaAs layer 17A and the amorphous N-doped GaAs layer 17B having a high resistivity, an N-doped GaAs layer 17C is formed underneath 17A and the gate electrode. Since the thickness of the additional semiconductor layer collectively denoted by reference numeral 17 is locally thick or thin, the electron-storing layer 18 is formed in the same manner as in FIG. 6 due to the local difference in the thickness of the additional semiconductor layer 17. More specifically, the thickness of the additional semiconductor layer 17 beneath the gate electrode 16 is small.

Figure 8:
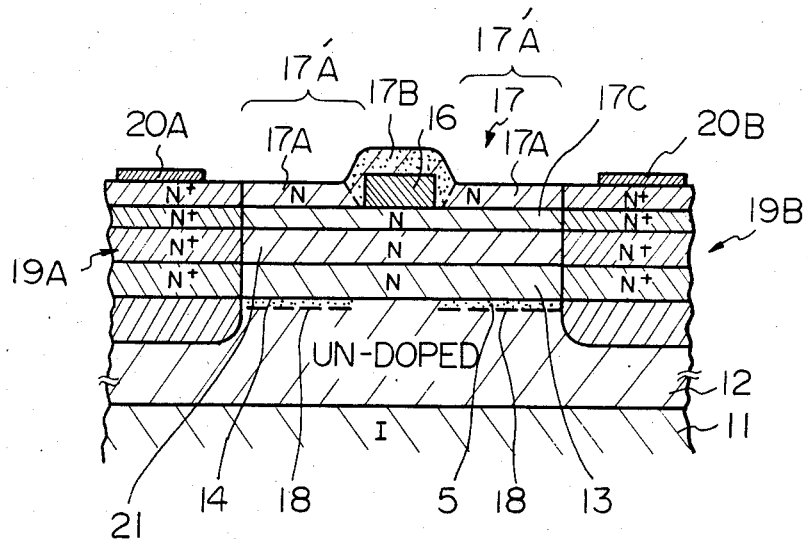

Referring to FIG. 8, the normally off-type HEMT has, in addition to the elements shown in FIG. 7, an intermediate layer 21 which lessens or eliminates the harmful effect which results when the additional semiconductor layer is directly grown on the second single crystalline semiconductor layer. The main composition of the intermediate layer 21 is identical to that of the second single crystalline semiconductor layer at its bottom surface, while the main composition of the intermediate layer 21 is identical to that of the additional semiconductor layer at its top surface. The rate of change of the main composition in the intermediate layer 21 in the growth direction is optional but is preferably gradual.

The explanation of the intermediate layer 21 relates to a case where the second single crystalline semiconductor layer is mainly a III-V group compound containing aluminum (Al). In this case, the difficulty involved in discontinuously growing a single crystalline GaAs on a single crystalline AlGaAs can be eliminated by continuously growing the intermediate layer 21 on the single crystalline AlGaAs, with the result that the single crystalline GaAs can be subsequently discontinuously grown on the intermediate layer, which is an advantage of the intermediate layer. This advantage cann be directly attained by changing the main composition of the intermediate layer described above.

In FIG. 8, the intermediate layer 21 is mainly composed of $Al_xGa_{1-x}As$. The aluminum content (x) is increased in the growth direction near the second single crystalline semiconductor layer (N-doped AlGaAs layer 13), and the aluminum concentration is decreased to zero in the portion of the intermediate layer 21 in contact with or beneath the additional semiconductor layer 17. When the N-doped AlGaAs layer 13 is $Al_{0.3}Ga_{0.7}As$ containing silicon as the N-type conductivity impurity at a concentration of approximately $2 \times 10^{18}/cm^3$, the aluminum content (x) of the $Al_xGa_{1-x}As$ mentioned above is gradually decreased from 0.3 to 0. The intermediate layer 21 contains silicon as the N-type conductivity impurity at a concentration which may be equal to that of the N-doped AlGaAs layer 13, i.e. $2 \times 10^{18}/cm^3$. The thickness of the intermediate layer 21 may be approximately 200 angstroms.

Figure 9:
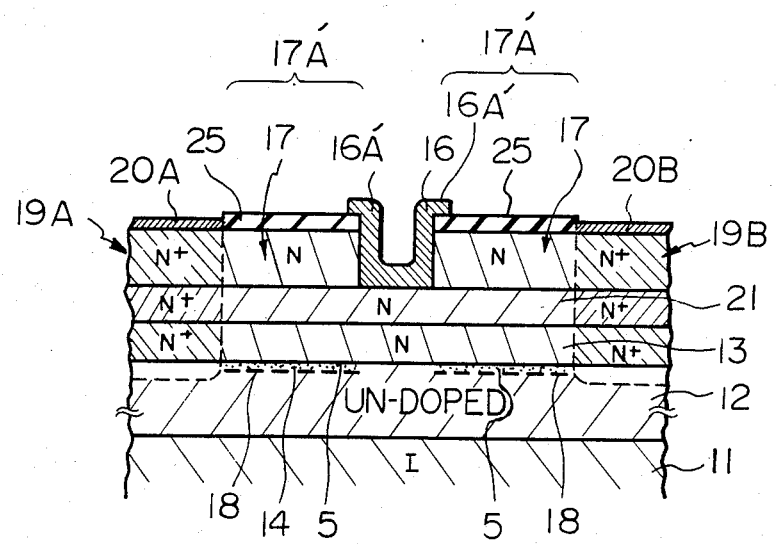

In an embodiment of the normally off-type HEMT, the gate electrode is in Schottky contact with the intermediate layer or the second single crystalline semiconductor layer via a groove formed in the additional semiconductor layer. FIG. 9 illustrates a case where the normally off-type HEMT has an intermediate layer 21 and the gate electrode 16 is in Schottky contact with the intermediate laye 21. The normally off-type HEMT of FIG. 9 has essentially the same structure as the HEMT illustrated in FIG. 8. However, the additional semiconductor layer 17 is provided with a groove which selectively exposes the top surface of the intermediate layer 21 where the aluminum concentration (x) of $Al_xGa_{1-x}As$ is virtually zero. In addition, the gate electrode 16 is deposited both on the selectively exposed top surface mentioned above and the wall of the groove intermediate layer 21. Furthermore, the ends 16A' of the gate electrode 16 are positioned on a silicon dioxide film 25.

Figure 3:
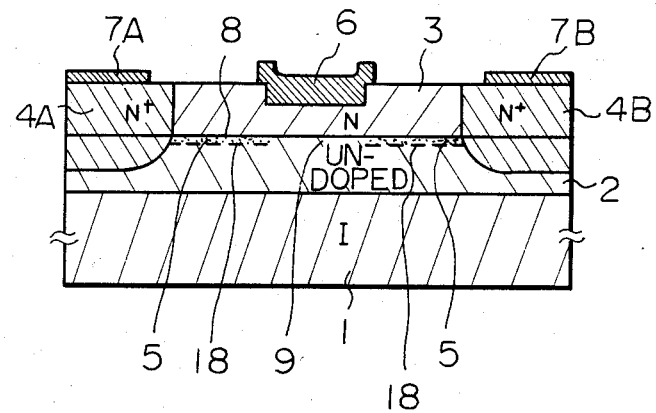
FIG. 3 is a drawing similar to FIG. 2 and shows a modified structure of the normally off-type HEMT.

In the normally off-type HEMT illustrated in FIG. 9, the groove is formed by means of an etching technique. However, the disadvantages due to the etching technique described with reference to FIG. 3 can be completely avoided due to the difference between the main composition of the intermediate layer 21 and the main composition of the additional layer 17. That is, when the selective removal of the additional semiconductor layer 17 is carried out so that the top surface of the intermediate layer 21 is exposed, the etching rate is suddenly decreased since aluminum, which is not at all contained in the additional semiconductor layer 17, is contained in the intermediate layer 21 at a variable content described hereinabove. And since the rate of etching of AlGaAs is from 1/50 to 1/100 times the rate of etching of GaAs, it is possible to completely stop etching so that the intermediate layer 21 is not removed. The etching accuracy is $\pm 10$ angstroms. As a result of such high etching accuracy the electron-storing layer 18 can be selectively formed as described with reference to FIG. 9.

Figure 10:
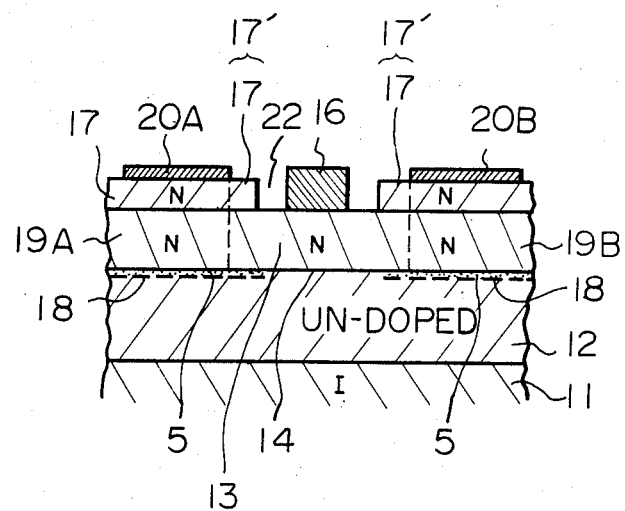

Referring to FIG. 10, the amorphous N-doped GaAs layer 17B (not shown) of the additional semiconductor layer 17 is selectively removed, with the result that a groove 22 is formed around the exposed gate electrode 16, in a case where the normally off-type HEMT does not comprise an intermediate layer. In the normally off-type HEMT illustrated in FIG. 10, a part of the N-doped GaAs layer beneath the source electrode 20A and the drain electrode 20B provides a reliable alloy surface which is free of any harmful oxide. The bonding property between the N-doped GaAs layer (the additional semiconductor layer 17) and the source and drain electrodes 20A and 20B, respectively, is excellent and ohmic contact between the two electrodes can be easily created.

Figure 11:
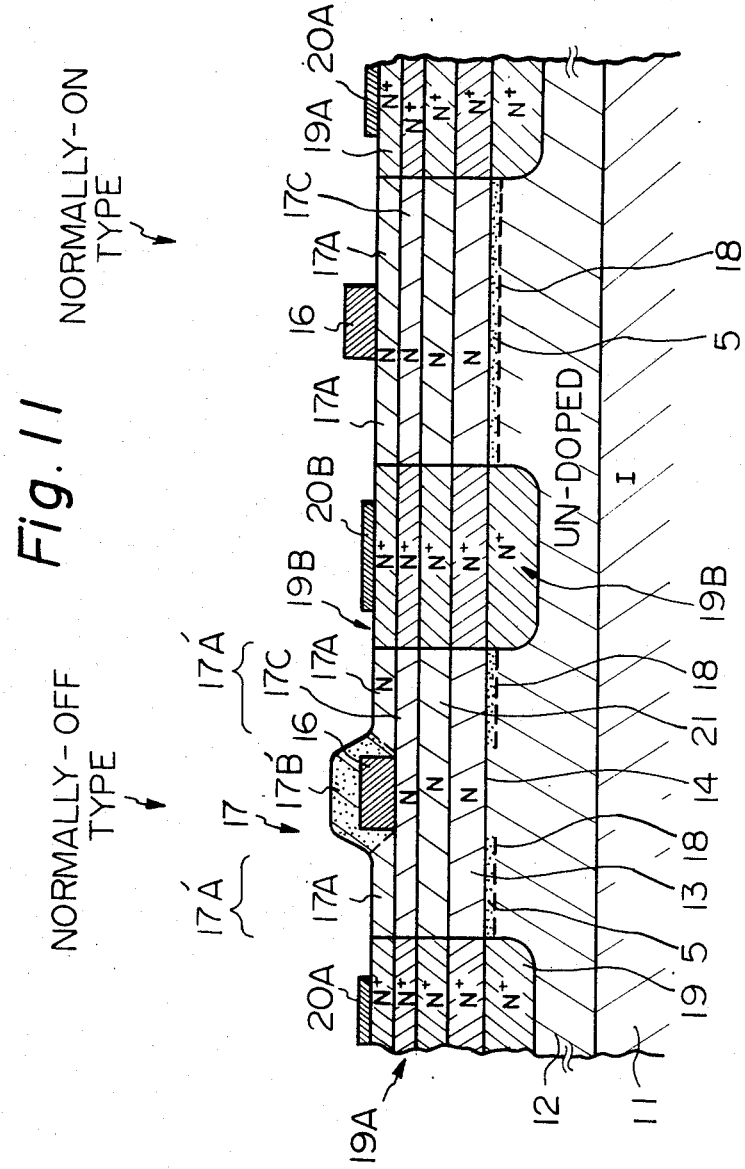
FIGS. 11 and 12 show a C-HEMT in which both normally on and normally off-type HEMTs are manufactured in the same chip in a complementary manner.

Referring to FIG. 11, the normally off-type HEMT having the same structure as the HEMT illustrated in FIG. 8, and the normally on-type HEMT are manufactured in the same semiconductor chip in a manner similiar to that in conventional E/D mode devices. The sheet-electron concentration of the layers 13, 17C, and 17A is, however, so high that the resistance of these layers and thus the time constant of the normally on-type HEMT are advantageously low, which contributes to the high operation speed of the E/D mode HEMT.

Figure 12:
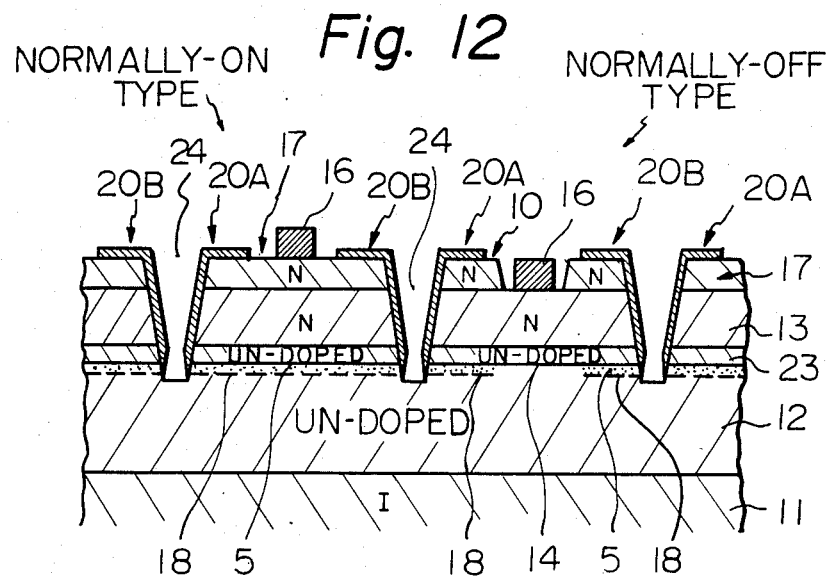

Referring to FIG. 12, the E/D mode HEMT comprises an additional semiconductor layer 17 (N-doped GaAs layer), an N-doped AlGaAs layer 13, and an undoped GaAs layer 12. In addition to these layers, an undoped AlGaAs layer 23 is interposed between the N-doped AlGaAs layer 13 and the undoped GaAs layer 12. The provision of an undoped AlGaAs layer is known in the prior art of the HEMT and such provision makes it possible to prevent, during production of the HEMT, the diffusion of the N-type conductivity impurities from the N-doped AlGaAs layer 13 into the heterojunction 14. Therefore, although not shown in FIGS. 4 through 11, the undoped AlGaAs layer 23 may be formed on the undoped GaAs layer 12.

The additional semiconductor layer 17 (N-doped GaAs layer), the N-doped AlGaAs layer 13, and the undoped AlGaAs layer 23 are removed at selected areas so that grooves 24 are formed in the top part of the undoped GaAs layer 12. Such selective removal to form the grooves 24 can be easily accomplished by means of a reactive sputter etching method in which the movement of the tetrafluorocarbon ($CF_4$) as the reactant is accelerated by energy on the order of 100 eV or by means of a wet etching method in which an etching agent containing fluoric acid (HF) as the reactant is used. The source electrode 20A and the drain electrode 20B extend from the top surface of the additional layer 17 to the electron-storing layers 18 via the side walls of the grooves 24.

The description hereinafter relates to production processes of the normally off-type HEMT.

The normally off-type HEMTs shown in FIGS. 6 through 8 can be produced by means of:

MBE-growing the first and second single crystalline layers (undoped GaAs layer 12 and N-doped AlGaAs layer 13), the intermediate layer 21, and the additional semiconductor layer 17; forming the source electrode 20A, the drain electrode 20B, and the gate electrode 16 by means of vacuum deposition and photolithography; and forming the source and drain regions 19A and 19B, respectively, by means of a diffusion or ion implantation method. The semiconductor layers below the gate electrode 16 can and should be continuously grown by means of the MBE method while the substrate 1 is heated preferably at 590° C.

One feature of the process according to the present invention is an improvement which comprises, after the formation of a gate electrode, the step of carrying out the crystal growth of an additional semiconductor layer extending from the top surface of an underneath semiconductor layer, such as the second single crystalline layer, the intermediate layer 21, or the underneath N-doped GaAs layer 17C, onto the gate electrode 16. Previous to starting the vacuum deposition of aluminum for the gate electrode 16, in the normally off-type HEMT before its completion, the MBE method is discontinued and the normally off-type HEMT is loaded into a vacuum evaporation vessel where a thick aluminum layer of for example 5,000 angstroms is formed on the normally off-type HEMT. The thick aluminum layer mentioned above is delineated by means of a known photolithography so that it is the only place where the gate electrode 16 can be formed. The metallic aluminum forms a Schottky barrier with respect to the underlying semiconductor layer.

Again, the MBE method is used to form the additional semiconductor layer 17 which covers the gate electrode 16. The amorphous N-doped AlGaAs layer 17B deposited on the gate electrode 16 can be selectively removed so as to allow an electrical connection between the metallic leads (not shown) and the gate electrode 16. A groove (not shown in FIGS. 6 through 8) is therefore formed around each gate electrode 16.

In the process described above, the formation of the additional semiconductor layer 17, which covers the gate electrode 16, is advantageous in that: the amorphous N-doped GaAs layer 17B can easily be selectively removed, for example by etching; the etching accuracy does not at all influence strict determination of the types of operation of the HEMT; and, a contact window to the gate electrode 16 can be formed in self-alignment with the formation of the gate electrode. In the process described hereinabove, the MBE method is used for crystal growth in a case where extremely strict control of the crystal parameter is required, while the photolithography and vacuum evaporation methods are used in the formation of elements of the normally off-type HEMT in a case where strict control of the dimensions of such elements is not necessary for determining the types of operation.

The E/D mode HEMT shown in FIG. 11 can be formed by the same process as the E/D mode HEMT in FIG. 8 until the underneath N-doped GaAs layer 17C is formed. Subsequently, the gate electrode 16 of the normally off-type HEMT is selectively formed, and GaAs is then grown by means of the MBE method, with the result that single crystalline and amorphous N-doped GaAs layers 17A and 17B, respectively, are formed. The formation of the gate electrode 16 of the normally on-type HEMT is then carried out and the source electrode 20A and drain electrode 20B of the normally on-type and normally off-type HEMT are simultaneously formed. As described with reference to FIG. 3, conventional etching of one of the single crystalline semiconductor layers, i.e. the second single crystalline semiconductor layer below the gate electrode, results in disadvantages such as instability or low reproducibility in respect to the types of operation and the threshold voltage of the normally off-type HEMT. According to a process of the present invention, these disadvantages can be eliminated even though etching one of the semiconductor layers of the normally off-type HEMT is carried out.

In this process, the additional semiconductor layer is selectively etched so as to expose the underlying single crystalline semiconductor layer having a main composition different from that of the additional semiconductor layer, and a gate electrode is subsequently formed on the exposed part of the second single crystalline semiconductor layer. Also in this process, a high etching accuracy can be attained because of the difference between the main composition of the additional semiconductor layer and the main composition of the underlying single crystalline layer, such as the intermediate layer and the second single crystalline semiconductor layer, can be effectively used to immediately stop etching as soon as the underlying single crystalline layer is just exposed.

A process for producing the normally off-type HEMT shown in FIG. 9 is explained with reference to FIGS. 13 through 15, in which the same elements of the normally off-type HEMT as those of FIG. 9 are denoted by the same reference numerals.

Figure 13:
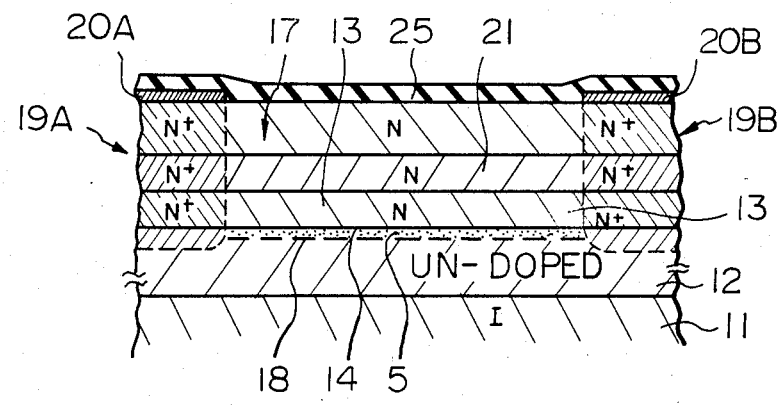
FIGS. 13 through 15 illustrate steps for producing the normally off-type HEMT shown in FIG. 9.

Referring to FIG. 13, the source and drain electrodes 20A and 20B, respectively, are made of gold or a gold-germanium alloy, and the gold or the like is selectively vacuum-evaporated on the additional semiconductor layer 17 designated as the source and drain regions 19A and 19B, respectively. A heat treatment is then carried out at 450° C. for approximately 3 minutes so as to alloy the gold or the like and thus create ohmic contact between the additional semiconductor layer 17 and the gold or the like. Subsequently, a silicon dioxide film 25 is formed, by means of a chemical vapor deposition (CVD) method, on the entire surface of the additional semiconductor layer 17.

Figure 14:
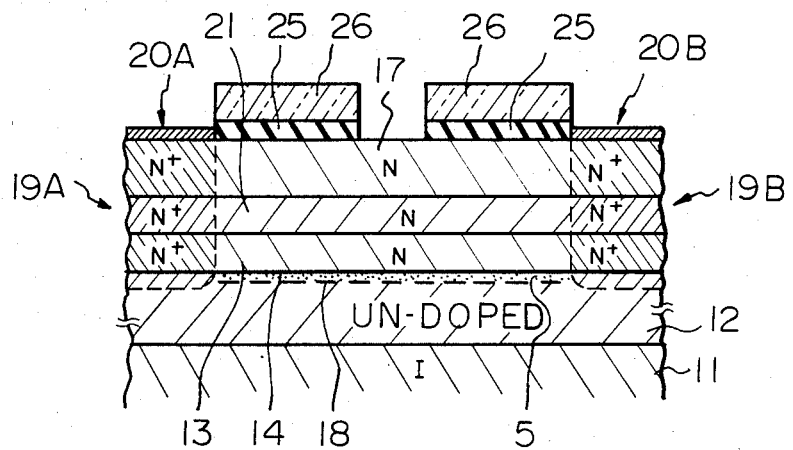

Referring to FIG. 14, a photoresist film 26 is applied on the silicon dioxide film 25 and is then selectively removed from a designated part of the silicon dioxide film 25 where the gate electrode (not shown in FIG. 14) is to be formed. The silicon dioxide film is also removed from the source and gate electrodes 20A and 20B, respectively. The so-delineated photoresist film 26 is then used as a mask for the selective removal of the silicon dioxide film 25 from the designated parts mentioned above. The silicon dioxide can be easily removed with an etching solution containing fluoric acid (HF) as the reactant.

Figure 15:
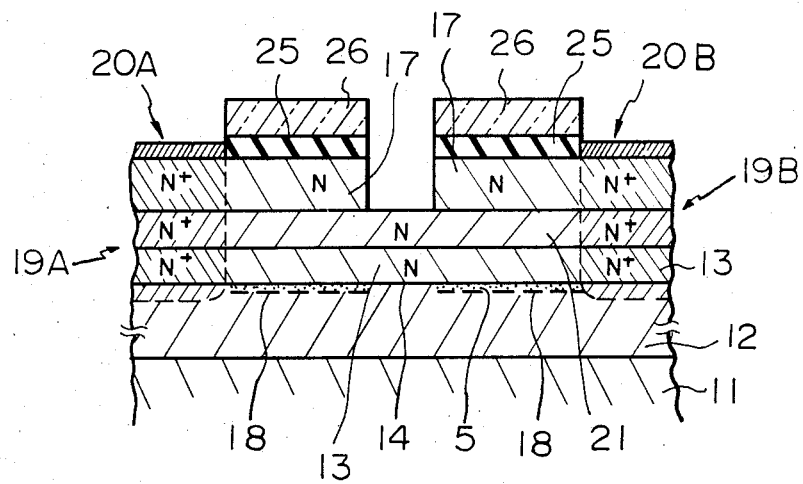

Referring to FIG. 15, the additional semiconductor layer 17 uncovered by the photoresist film 26 is removed so that the intermediate layer 21 is exposed. Since the additional semiconductor layer 17 is mainly composed of GaAs and the intermediate layer 21 is mainly composed of $Al_xGa_{1-x}As$, a sudden change in the main composition occurs, due to the exposure of the aluminum atoms to the etching medium, when the intermediate layer 21 is exposed. If this sudden change is detected, it is possible to stop etching in such a manner that an appreciable number of atom layers of $Al_xGa_{1-x}As$ is not removed. When a plasma etching method is employed for the selective removal of the intermediate layer 21 mainly composed of $Al_xGa_{1-x}As$, the optical spectrum of the aluminum atoms generating a wave length of 3,960 angstroms should be detected by an appropriate monitor, such as a photodiode. Consequently, etching can be stopped so that the quasi two-dimensional electron gas 5 formed in proximity to the heterojunction 14 before the selective removal mentioned above is carried out (c.f. FIGS. 13 and 14), disappears, as shown in FIG. 15, in proximity to the heterojunction 14 below the selectively removed additional semiconductor layer 17. Dichlorocarbon difluoride ($CCl_2F_2$) can be used as the reactant in the plasma etching method. This reactant advantageously has a high etching rate in respect to GaAs and a low etching rate in respect to AlGaAs, the rate being from 1/50 to 1/100 times that of GaAs. The etching accuracy is approximately 50 angstroms when dichlorocarbon difluoride ($CCl_2F_2$) and a monitor of the plasma luminescence of aluminum atoms is employed.

As understood from the description above, the additional semiconductor layer can provide various advantages, such as a short gate length, self-alignment of the conduction channel with respect to the gate electrode, and the easy creation of an ohmic contact of the source and drain electrodes.

A specific preferred example of the semiconductor elements of the normally off-type HEMT according to the present invention is as follows:

TABLE 3

| Semiconductor Layers | Main Composition | Thickness of Layers (angstroms) | Impurity Concentration $(cm^{-3})$ |
|---|---|---|---|
| First Single Crystalline Semiconductor Layer | GaAs | 2,000 | Approximately $10^{16}$ (undoped) |
| Second Single Crystalline Semiconductor Layer | $Al_{0.3}Ga_{0.7}As$ | 300 | $2 \times 10^{18}$ |
| Intermediate Layer | $Al_xGa_{1-x}As$ (The aluminum content (x) changes from 0.3 to 0.0 in the direction of crystal growth) | 300 | $2 \times 10^{18}$ |
| Additional Semiconductor Layer (Underneath Layer) | GaAs | 400 | $2 \times 10^{18}$ |
| Additional Semiconductor Layer (Upper Layer) | GaAs | 400 | $2 \times 10^{18}$ |

I claim:
1. A semiconductor device comprising:
a first single crystalline semiconductor layer having a first electron affinity;
a second single crystalline semiconductor layer, formed on said first single crystalline semiconductor layer, having a second electron affinity different from that of said first electron affinity of said first single crystalline semiconductor layer, said second single crystalline semiconductor layer forming a heterojunction with said first single crystalline semiconductor layer, the difference between said first and second electron affinities allowing the formation of a quasi two-dimensional electron gas in said first single crystalline semiconductor layer along said heterojunction;
a pair of electrodes electrically connected to said quasi two-dimensional electron gas, said electrodes being formed apart from each other, said quasi two-dimensional electron gas between said pair of electrodes forming a conduction channel between said pair of electrodes;
a gate electrode, formed over said second single crystalline semiconductor layer between said pair of electrodes, for controlling the conduction of electrons of said quasi two-dimensional electron gas so as to control the electrical conduction through said conduction channel between said pair of electrodes; and
an additional semiconductor layer having an N-type conductivity, formed on portions of said second single crystalline semiconductor layer and on said gate electrode, comprising a semiconductor material different from that of said second single crystalline semiconductor layer, for enhancing the electron concentration of said quasi two-dimensional electron gas in areas under said portions of said second second single crystalline semiconductor layer.

2. A semiconductor device according to claim 1, wherein part of said additional semiconductor layer has a groove so that said second single crystalline semiconductor layer is selectively exposed, and said gate electrode is formed in said groove.

3. A semiconductor device according to claim 1, wherein a portion of said additional semiconductor layer is formed between said gate electrode and said second single crystalline semiconductor layer, and wherein the thickness of the portion of said additional semiconductor layer beneath said gate electrode is less than the thickness of the portion of said additional semiconductor layer in an area adjacent to said gate electrode.

4. A semiconductor device according to claim 3, further comprising an intermediate layer having an upper and lower surface, formed between said second single crystalline semiconductor layer and said additional semiconductor layer, wherein said lower surface of said intermediate layer is formed of a semiconductor material having a composition substantially identical to that of said second single crystalline semiconductor layer, and wherein said upper surface of said intermediate layer is formed of a semiconductor material having a composition substantially identical to that of said additional semiconductor layer.

5. A semiconductor device according to claim 4, wherein a rate of change of said composition of said semiconductor material between said upper and lower surfaces of said intermediate layer varies continuously.

6. A semiconductor device according to claim 1, further comprising an intermediate layer having an upper and lower surface, formed between said second single crystalline semiconductor layer and said additional semiconductor layer, wherein said lower surface of said intermediate layer is formed of a semiconductor material having a composition substantially identical to that of said second single crystalline semiconductor layer, and wherein said upper surface of said intermediate layer is formed of a semiconductor material having a composition substantially identical to that of said additional semiconductor layer.

7. A semiconductor device according to claim 6, wherein said additional semiconductor layer is provided with a groove so that said upper surface of said intermediate layer is selectively exposed, and wherein said gate electrode is formed in said groove.

8. A semiconductor device according to claim 1, 3, 4, or 5, wherein said semiconductor device further comprises a normally off-type transistor (HEMT) and a normally on-type transistor (HEMT) and includes a first portion where said normally off-type transistor (HEMT) is formed and a second portion where said normally on-type transistor (HEMT) is formed, and wherein said additional semiconductor layer is present in both said first and second portions of said semiconductor device.

9. A semiconductor device according to claim 1, 3, 4 or 5, wherein said first single crystalline semiconductor layer is composed of GaAs, wherein said second single crystalline semiconductor layer is composed of AlGaAs, and wherein said additional single crystalline semiconductor layer is composed of GaAs.

10. A semiconductor device according to claim 1, wherein said gate electrode comprises aluminum.

11. A semiconductor device according to claim 10, wherein said aluminum gate electrode is approximately 5000 angstroms thick.

12. A semiconductor device according to claim 1, wherein said first single crystalline semiconductor layer is approximately 2000 angstroms thick, wherein said second single crystalline semiconductor layer is 200 to 1000 angstroms thick, and wherein said additional semiconductor layer is 200 to 1000 angstroms thick.

13. A semiconductor device according to claim 1, wherein said gate electrode comprises aluminum.

14. A semiconductor device according to claim 13, wherein said aluminum gate electrode is approximately 5000 angstroms thick.

15. A semiconductor device according to claim 1, wherein said first single crystalline semiconductor layer is approximately 2000 angstroms thick, wherein said second single crystalline semiconductor layer is 200 to 1000 angstroms thick, and wherein said additional semiconductor layer is 200 to 1000 angstroms thick.

16. A semiconductor device according to claim 3, wherein said gate electrode comprises aluminum.

17. A semiconductor device according to claim 16, wherein said aluminum gate electrode is approximately 5000 angstroms thick.

18. A semiconductor device according to claim 3, wherein said first single crystalline semiconductor layer is approximately 2000 angstroms thick, wherein said second single crystalline semiconductor layer is 200 to 1000 angstroms thick, and wherein said additional semiconductor layer is 200 to 1000 angstroms thick.

19. A semiconductor device according to claim 4, wherein said gate electrode comprises aluminum.

20. A semiconductor device according to claim 19, wherein said aluminum gate electrode is approximately 5000 angstroms thick.

21. A semiconductor device according to claim 4, wherein said first single crystalline semiconductor layer is approximately 2000 angstroms thick, wherein said second single crystalline semiconductor layer is 200 to 1000 angstroms thick, wherein said additional semiconductor layer is 200 to 1000 angstroms thick, and wherein said intermediate layer is approximately 200 angstroms thick.

22. A semiconductor device according to claim 21, wherein said aluminum gate electrode is approximately 5000 angstroms thick.

23. A semiconductor device according to claim 5, wherein said gate electrode comprises aluminum.

24. A semiconductor device according to claim 5, wherein said first single crystalline semiconductor layer is approximately 2000 angstroms thick, wherein said second single crystalline semiconductor layer is 200 to 1000 angstroms thick, wherein said additional semiconductor layer is 200 to 1000 angstroms thick, and wherein said intermediate layer is approximately 200 angstroms thick.

25. A semiconductor device according to claim 5, wherein said composition of said intermediate layer comprises aluminum galium arsenide wherein a larger percentage of aluminum is present at said lower surface of said intermediate layer than is present at said upper surface of said intermediate layer, the percentage of aluminum in the portions between said upper and lower surfaces varying continuously.

26. A semiconductor structure comprising:

a first single crystalline semiconductor layer of a first semiconductor material having a first electron affinity;

a second single crystalline semiconductor layer of a second semiconductor material having a second electron affinity, formed on said first single crystalline semiconductor layer;

a gate electrode formed on said second single crystalline semiconductor layer; and an additional semiconductor layer doped to a desired conductivity type and formed on said second single crystalline semiconductor layer and said gate electrode.

27. A semiconductor structure according to claim 26, wherein said additional semiconductor layer is doped so that a two-dimensional electron gas is formed in regions of said first single crystalline layer underlying said additional semiconductor layer.

28. A semiconductor device structure according to claim 27, wherein said first single crystalline layer is not intentionally doped, and said second single crystalline layer is doped to said desired conductivity type.

29. A semiconductor structure according to claim 28, wherein said additional semiconductor layer comprises said first semiconductor material.

30. A semiconductor structure according to claim 29, wherein said first semiconductor material comprises GaAs, and said second semiconductor material comprises AlGaAs.

31. A semiconductor structure according to claim 26, wherein said additional semiconductor layer has an N-type conductivity.

* * * * *